(12) United States Patent
Arai

(10) Patent No.: US 10,666,194 B2
(45) Date of Patent: May 26, 2020

(54) OVEN-CONTROLLED CRYSTAL OSCILLATOR

(71) Applicant: NIHON DEMPA KOGYO CO., LTD., Tokyo (JP)

(72) Inventor: Junichi Arai, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 59 days.

(21) Appl. No.: 15/640,603

(22) Filed: Jul. 3, 2017

(65) Prior Publication Data
US 2018/0013386 A1 Jan. 11, 2018

(30) Foreign Application Priority Data

Jul. 7, 2016 (JP) .................. 2016-135071
Apr. 19, 2017 (JP) .................. 2017-082676

(51) Int. Cl.
*H03B 5/32* (2006.01)
*H03L 1/02* (2006.01)
*H01L 23/31* (2006.01)
*H03L 7/00* (2006.01)
*H03L 1/04* (2006.01)
*H01L 23/00* (2006.01)
*H01L 23/495* (2006.01)

(52) U.S. Cl.
CPC .......... *H03B 5/32* (2013.01); *H01L 23/3121* (2013.01); *H03L 1/02* (2013.01); *H03L 1/04* (2013.01); *H03L 7/00* (2013.01); *H01L 23/49596* (2013.01); *H01L 24/29* (2013.01); *H01L 24/32* (2013.01); *H01L 2224/2919* (2013.01); *H01L 2224/32225* (2013.01); *H01L 2224/32245* (2013.01); *H01L 2224/32265* (2013.01); *H01L 2224/48229* (2013.01); *H01L 2224/48247* (2013.01); *H01L 2924/1304* (2013.01); *H01L 2924/19104* (2013.01); *H01L 2924/19107* (2013.01)

(58) Field of Classification Search
CPC .. H03L 1/04; H03L 1/028; H03B 5/32; H03B 5/04; H01L 24/29; H01L 2924/1304; H01L 2924/19104; H01L 2924/19107; H01L 23/49596; H01L 2224/32265; H01L 2224/3225; H01L 2224/48247; H01L 2224/48229
USPC .............................. 331/158, 176, 116 FE, 66
See application file for complete search history.

(56) References Cited

U.S. PATENT DOCUMENTS

2010/0052802 A1* 3/2010 Arai .................. H03L 1/04
331/69
2010/0085124 A1* 4/2010 Stolpman .............. H03L 1/04
331/70
(Continued)

FOREIGN PATENT DOCUMENTS

JP 2009232239 10/2009
JP 2010154400 7/2010

*Primary Examiner* — Arnold M Kinkead
(74) *Attorney, Agent, or Firm* — JCIPRNET

(57) ABSTRACT

An oven-controlled crystal oscillator includes a base substrate, a power transistor, and a surface mount type crystal resonator. The base substrate has a bottom surface on which a mounting terminal for surface mounting is disposed. The power transistor is mounted on the base substrate. The surface mount type crystal resonator is mounted on the power transistor.

16 Claims, 5 Drawing Sheets

(56) References Cited

U.S. PATENT DOCUMENTS

| | | | |
|---|---|---|---|
| 2010/0123522 A1* | 5/2010 | Kasahara | H03B 1/02 331/69 |
| 2010/0164635 A1* | 7/2010 | Kudo | H03B 1/02 331/69 |
| 2012/0206998 A1* | 8/2012 | Numata | G04R 20/10 368/47 |
| 2014/0009235 A1* | 1/2014 | Yoshimura | H03L 1/04 331/66 |
| 2016/0156330 A1* | 6/2016 | Shimodaira | H03H 9/17 310/343 |

* cited by examiner

OVEN-CONTROLLED CRYSTAL OSCILLATOR

CROSS-REFERENCE TO RELATED APPLICATIONS

This application is based on and claims priority under 35 U.S.C. § 119 to Japanese Patent Application No. 2016-135071, filed on Jul. 7, 2016, and Japanese Patent Application No. 2017-082676, filed on Apr. 19, 2017, the entire contents of which are incorporated herein by reference.

TECHNICAL FIELD

This disclosure relates to an oven-controlled crystal oscillator including a crystal resonator, a heater resistor and a power transistor as a heat source, and a temperature sensor.

DESCRIPTION OF THE RELATED ART

An oven-controlled crystal oscillator is a crystal oscillator with enhanced frequency stability usually by controlling to keep a temperature at which a frequency change with respect to a temperature of a crystal resonator becomes local minimum. For example, the oven-controlled crystal oscillator is widely used in a communication device for a base station that requires a frequency deviation in ppb level, FIG. 5 is a drawing describing a related example and is a sectional drawing of an oven-controlled crystal oscillator 200. The oven-controlled crystal oscillator 200 is constituted of a crystal resonator 13, circuit elements 14 that constitute an oscillator circuit and a temperature control circuit, a first circuit board 15 and a second circuit board 16, and an oscillator container 17. The crystal resonator 13 is constituted by housing, for example, an AT-cut or an SC-cut quartz-crystal vibrating piece in a package made of a laminated ceramic.

The oscillator container 17 is constituted of a metal base 22 that includes external terminals and a metal cover 23. The metal base 22 and the metal cover 23 are bonded by, for example, resistance welding. In an airtight space that these metal base 22 and metal cover 23 form, the crystal resonator 13, the circuit elements 14, the first circuit board 15, and the second circuit board 16 are housed.

The AT-cut quartz-crystal vibrating piece used for the crystal resonator 13 has a frequency versus temperature characteristic in a cubic curve. In the oven-controlled crystal oscillator 200, an oven temperature is usually set to an apex of the cubic curve of the frequency versus temperature characteristic, that is, a region with the smallest temperature change, in order to control the temperature inside the oven-controlled crystal oscillator 200 to remain at a proximity of the apex even when an ambient temperature of the oven-controlled crystal oscillator 200 changes. For the temperature control, a thermosensor (a thermistor, a thermocouple, and a diode) and a heat source (a power transistor, a power MOSFET, and a heater resistor) are used as the circuit elements 14.

The first circuit board 15 and the second circuit board 16 are made of glass epoxy boards or ceramic boards. Both include wiring patterns on their front surfaces or back surfaces. One principal surface of the first circuit board 15 includes the crystal resonator 13, and the other principal surface includes, for example, a heater resistor 19 and the thermosensor of the temperature control circuit. Then, on the heater resistor 19 and the thermosensor, a liquid heat conductive resin 20 is applied so as to, for example, connect to a surface of the second circuit board 16, and cured.

On both principal surfaces of the second circuit board 16, the circuit elements 14 of an oscillator circuit and a temperature control circuit other than described above are mounted. The first circuit board 15 and the second circuit board 16 have a two-tier structure in which plate surfaces are opposed by being electrically and mechanically connected with metal pins 18. The heat conductive resin 20 between the first circuit board 15 and the second circuit board 16 strengthens thermal coupling between the heater resistor, the thermosensor, and the circuit elements 14 of the oscillator circuit and the temperature control circuit.

The oscillator container 17 is constituted of at least a metal base through which lead wires that are airtightly sealed with glass at four corners as hermetic terminals pass and a metal cover sealed to the metal base by, for example, resistance welding. The hermetic terminals of the metal base are electrically and mechanically connected to the second circuit board 16. The second circuit board 16 is hermetically sealed within the oscillator container 17 together with the first circuit board 15. See Japanese Unexamined Patent Application Publication No. 2010-154400 and Japanese Unexamined Patent Application Publication No. 2009-232239.

In the related oven-controlled crystal oscillator 200 having the above-described structure where the first circuit board 15 and the second circuit board 16 are three-dimensionally connected with the metal pins 18, the structure has constructively required a height to some extent since the first circuit board 15 and the second circuit board 16 constitute the two-tier structure in which the first circuit board 15 and the second circuit board 16 are opposed. Therefore, the structure has been unsuitable for downsizing and reducing height. The circuit elements 14 of the oscillator circuit and the temperature control circuit, and the crystal resonator 13 being decentrally disposed in a plurality of circuit boards generates spatial intervals between the circuit elements 14 and the crystal resonator 13. Therefore, in order to perform a further stabilized temperature control, examination and optimization of element arrangements by considering the thermal coupling has been required, thus requiring a lot of time.

A need thus exists for an oven-controlled crystal oscillator which is not susceptible to the drawback mentioned above.

SUMMARY

This disclosure provides an oven-controlled crystal oscillator that includes a base substrate, a power transistor, and a surface mount type crystal resonator. The base substrate has a bottom surface on which a mounting terminal for surface mounting is disposed. The power transistor is mounted on the base substrate. The surface mount type crystal resonator is mounted on the power transistor.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

First Embodiment

Figure 1A:
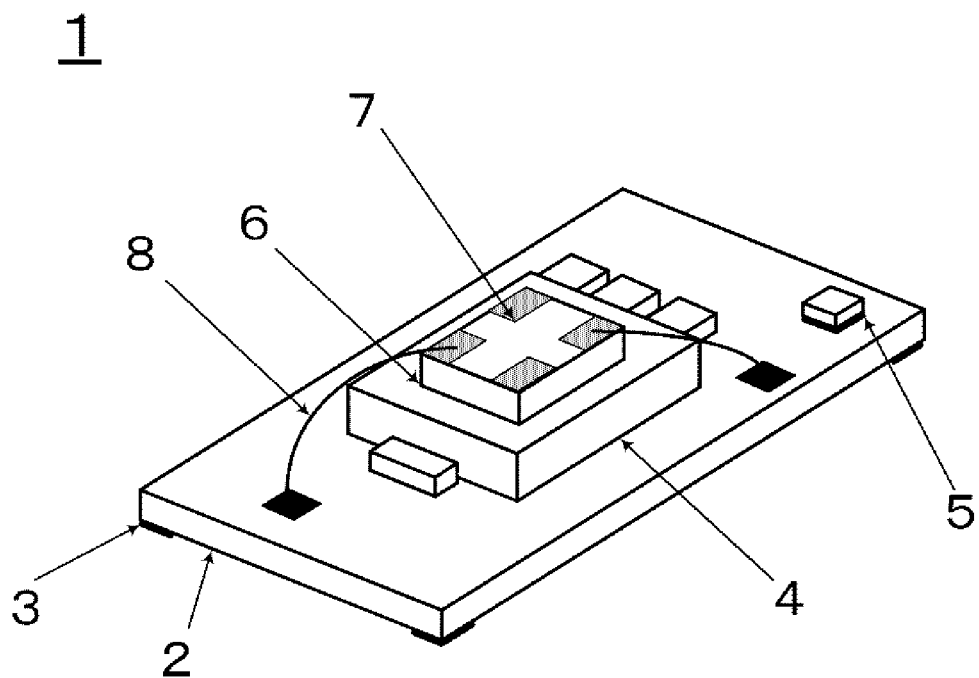
FIG. 1A is a perspective view of an oven-controlled crystal oscillator according to a first embodiment disclosed here.
Figure 1B:
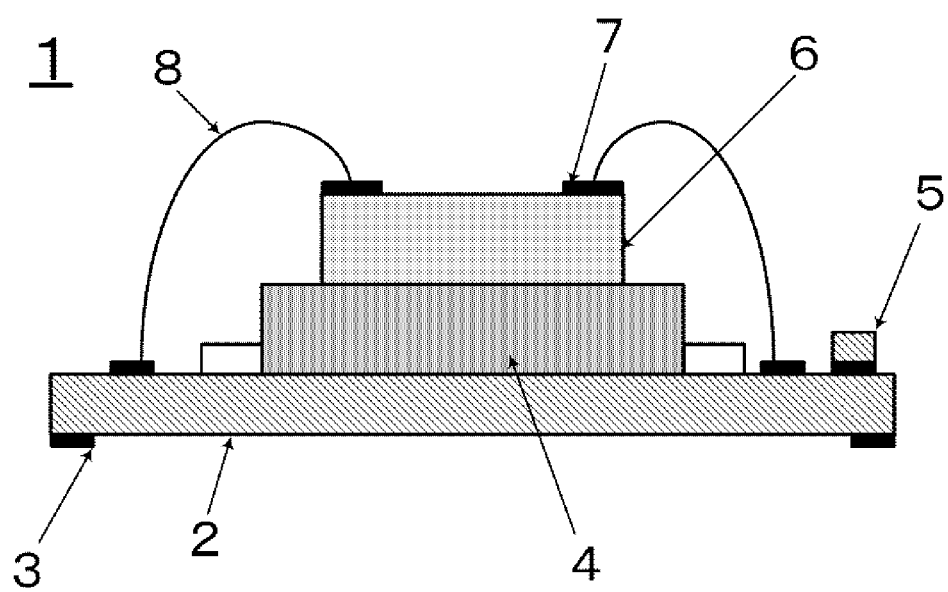
FIG. 1B is a sectional drawing of the oven-controlled crystal oscillator according to the first embodiment disclosed here.

An oven-controlled crystal oscillator 1 according to a first embodiment disclosed here will be described with reference to the drawings. FIG. 1A is a perspective view of the oven-controlled crystal oscillator 1 according to the first embodiment disclosed here. FIG. 1B is a sectional drawing of the oven-controlled crystal oscillator 1 according to the first embodiment disclosed here. In FIG. 1A and FIG. 1B, a mold resin used for sealing is not illustrated. As illustrated in FIG. 1A and FIG. 1B, the oven-controlled crystal oscillator 1 disclosed here is constituted of a base substrate 2, a power transistor 4, and a surface mount type crystal resonator 6.

On the base substrate 2 that includes a plurality of mounting terminals 3 on a back surface, the power transistor 4 including terminals corresponding to an emitter, a collector, and a base is mounted. For the base substrate, for example, a glass epoxy base plate is used. Each of the terminals of the power transistor 4 is electrically and mechanically connected to a wiring pattern (not illustrated) formed on the base substrate 2 with a solder. Then, the terminals of the power transistor 4 corresponding to the emitter, the collector, and the base are connected to a temperature control circuit.

In this disclosure, for a crystal resonator constituting the oven-controlled crystal oscillator 1, the surface mount type crystal resonator 6 is suitable for reducing height and downsizing of the oven-controlled crystal oscillator. The surface mount type crystal resonator 6 forms a housing space for housing a quartz-crystal vibrating piece with a base made of a laminated ceramic and a lid made of a metal.

For quartz-crystal vibrating piece, an AT-cut or an SC-cut quartz-crystal vibrating piece is used. While a base side on which an external terminal 7 is formed facing upward, a lid side, which is a bottom surface, is bonded on an upper surface of the power transistor 4. A resin adhesive is used for bonding between the power transistor 4 and the surface mount type crystal resonator 6. For the resin adhesive, one having a high thermal conductivity, such as a silicon resin, is used.

The surface mount type crystal resonator 6 is directly bonded on the power transistor 4, which is a heat source. Therefore, a heat outflow to an outside is reduced and heat transmission efficiency between the power transistor 4 and the surface mount type crystal resonator 6 becomes satisfactory.

The external terminal 7 of the surface mount type crystal resonator 6 is electrically connected to the base substrate 2. The external terminal 7 is connected to the wiring pattern (not illustrated) formed on the base substrate 2 using a conductive member, such as bonding wires 8. For the bonding wire 8, for example, a gold (Au) thin wire is used.

Furthermore, a thermosensor 5 is mounted on the base substrate 2. The thermosensor 5 detects a temperature of the oven-controlled crystal oscillator 1 and transmits temperature information to the temperature control circuit. For the thermosensor 5, a thermistor or a resistor having resistance that largely changes with respect to a temperature is used. The thermosensor 5 is electrically connected to the wiring pattern (not illustrated) on the base substrate 2 with, for example, the solder. Similar to the power transistor 4, since the thermosensor 5 is mounted on the base substrate 2, a heat generated by the power transistor 4 is received by the thermosensor 5 through a short distance via the base substrate 2, thereby ensuring an accurate temperature measurement.

In this embodiment, the power transistor 4 and the thermosensor 5 are directly bonded on a surface of the base substrate 2 via, for example, the solder. The surface mount type crystal resonator 6 is directly connected to the surface of the power transistor 4. Thus, a height from the base substrate 2 becomes a height of each of the stacked elements. Regarding an area that the oven-controlled crystal oscillator 1 of the disclosure occupies, a small area is enough since the oven-controlled crystal oscillator 1 is constituted of a minimum necessary, such as the power transistor 4, the surface mount type crystal resonator 6, the thermosensor 5, and the circuit elements of the oscillator circuit and the temperature control circuit. The circuit elements of the oscillator circuit and the temperature control circuit (not illustrated) are mounted, for example, the surface of the base substrate 2 and at proximity of the power transistor 4.

Accordingly, compared with the conventional oven-controlled crystal oscillator using a plurality of circuit boards and metal pins, the oven-controlled crystal oscillator of this disclosure can be disposed in a further smaller area. Therefore, there are advantages that a temperature deviation between each of the circuit elements is small, the temperature control using the temperature control circuit is easily stabilized, and power consumption is small.

The power transistor 4 and the surface mount type crystal resonator 6 have surface areas on sides where the power transistor 4 and the surface mount type crystal resonator 6 are bonded. It is preferred that the surface area on the side of the power transistor 4 be larger than the surface area on the side of the surface mount type crystal resonator. Such configuration causes an entire surface of the surface mount type crystal resonator 6 to contact a surface of the power transistor 4. This causes the entire surface of the surface mount type crystal resonator 6 to equally receive the heat from the power transistor 4, which is the heat source, thus stabilizing the temperature control.

The power transistor 4 may include the circuit elements that constitute the oscillator circuit and the temperature control circuit mounted thereon. Then, in the case where, for example, the circuit elements of the oscillator circuit and the temperature control circuit are integrated as an IC chip presenting a rectangular parallelepiped shape similar to the surface mount type crystal resonator 6, fulfilling the following relationship arranges both the IC chip of the oscillator circuit and the temperature control circuit, and the surface mount type crystal resonator 6 within the surface of the power transistor 4. The relationship is "a short side length of the IC chip of the oscillator circuit and the temperature control circuit+a short side length of the surface mount type crystal resonator 6<a short side length of the power transistor 4, and both a long side length of the IC chip of the oscillator circuit and the temperature control circuit and a long side length of the surface mount type crystal resonator 6 are equal to or less than the long side length of the power transistor 4." With this arrangement, temperatures of the power transistor 4, the surface mount type crystal resonator 6, and the IC chip of the oscillator circuit and the temperature control circuit approximately correspond. The stabilized temperature control ensures obtaining a crystal oscillator with reduced frequency variation. While the circuit elements that constitute the oscillator circuit include ones that change characteristics due to the temperature, mounting them on the power transistor 4 makes the temperature uniform, including the surface mount type crystal resonator 6, thereby ensuring a further stabilized temperature control. The circuit elements constituting the oscillator circuit and the temperature control circuit may be mounted on a region where the external terminals of the surface mount type crystal resonator 6 are not formed.

Figure 2A:
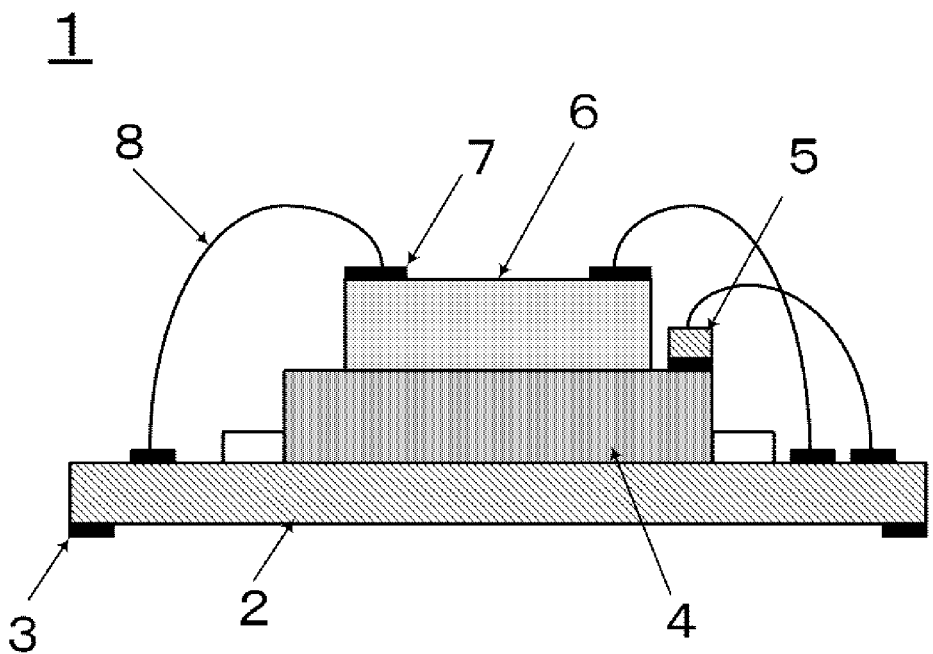
FIG. 2A is a sectional drawing of the oven-controlled crystal oscillator in a first modification where a thermosensor is mounted on a power transistor.

FIG. 2A is a sectional drawing of the oven-controlled crystal oscillator 1 in a first modification where the thermosensor 5 is mounted on the power transistor 4. Mounting the thermosensor 5 onto the power transistor 4 ensures accurately measuring a temperature of the surface mount type crystal resonator 6 that is similarly mounted on the power transistor 4. Therefore, the oven-controlled crystal oscillator 1 with a stabilized temperature control is obtained. In FIG. 2A, the mold resin used for sealing is not illustrated.

Figure 2B:
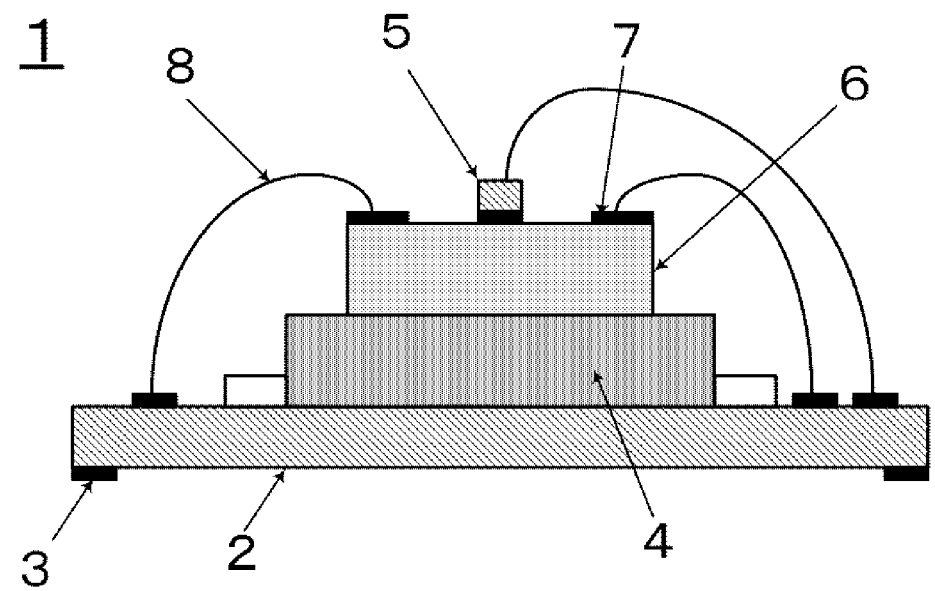
FIG. 2B is a sectional drawing of the oven-controlled crystal oscillator in a second modification where the thermosensor is mounted on a surface mount type crystal resonator.

FIG. 2B is a sectional drawing of the oven-controlled crystal oscillator 1 in a second modification where the thermosensor 5 is mounted on the surface mount type crystal resonator 6. Mounting the thermosensor 5 directly on the surface mount type crystal resonator 6, which has a large effect on an oscillation frequency, ensures accurately measuring a temperature of the surface mount type crystal resonator 6, thereby obtaining the oven-controlled crystal oscillator 1 the stabilized temperature control. In FIG. 2B, the mold resin used for sealing is not illustrated.

Figure 3A:
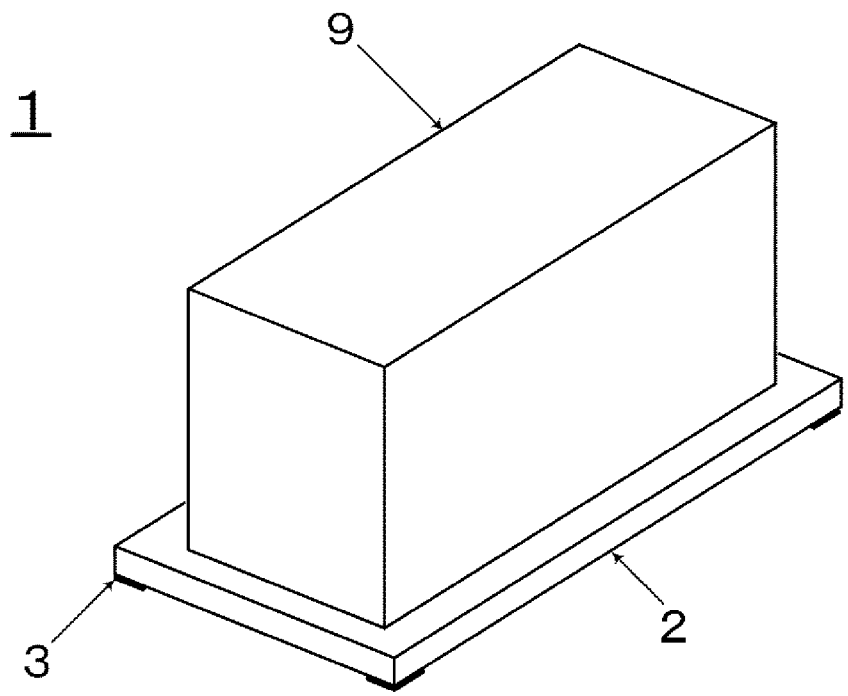
FIG. 3A is a perspective view of the oven-controlled crystal oscillator covered with a mold resin.
Figure 3B:
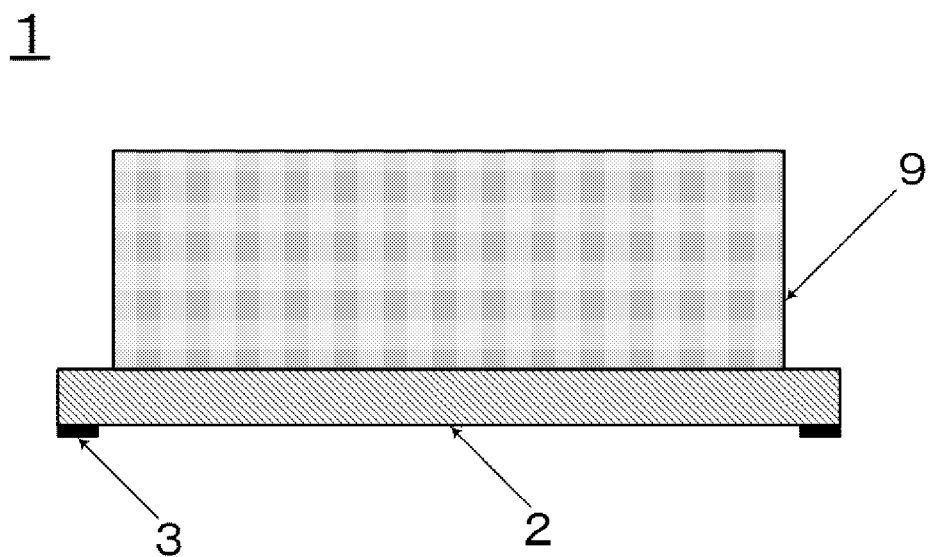
FIG. 3B is a side view of the oven-controlled crystal oscillator covered with the mold resin.

FIG. 3A is a perspective view of the oven-controlled crystal oscillator 1 covered with a mold resin 9. FIG. 3B is a side view of the oven-controlled crystal oscillator 1 covered with the mold resin 9. The mold resin 9 is formed by resin molding that is performed for the base substrate 2 after the circuit elements, such as the power transistor 4, are mounted on the base substrate 2. For the resin molding, for example, compression molding, transfer molding, and injection molding are used.

The mold resin 9 is formed so as to cover the power transistor 4, the surface mount type crystal resonator 6, the thermosensor 5, the bonding wires 8 and similar part on the base substrate 2. Disposing the mold resin 9 ensures protecting each of the circuit elements, such as the power transistor 4, and the bonding wires 8 from, for example, humidity and impact. Therefore, the oven-controlled crystal oscillator 1 that is insusceptible to a change of an ambient temperature of the oven-controlled crystal oscillator 1 and ensures further stabilized control temperature is obtainable.

The mold resin 9 is not limited to cover the whole of each of the circuit elements and the bonding wires 8, and may expose a part of each of the circuit elements and the bonding wires 8.

Second Embodiment

Next, an oven-controlled crystal oscillator 100 according to a second embodiment disclosed here will be described with reference to the drawings. In the following description, elements identical to the first embodiment are designated with identical reference numerals, and therefore such explanation is simplified or omitted.

Figure 4A:
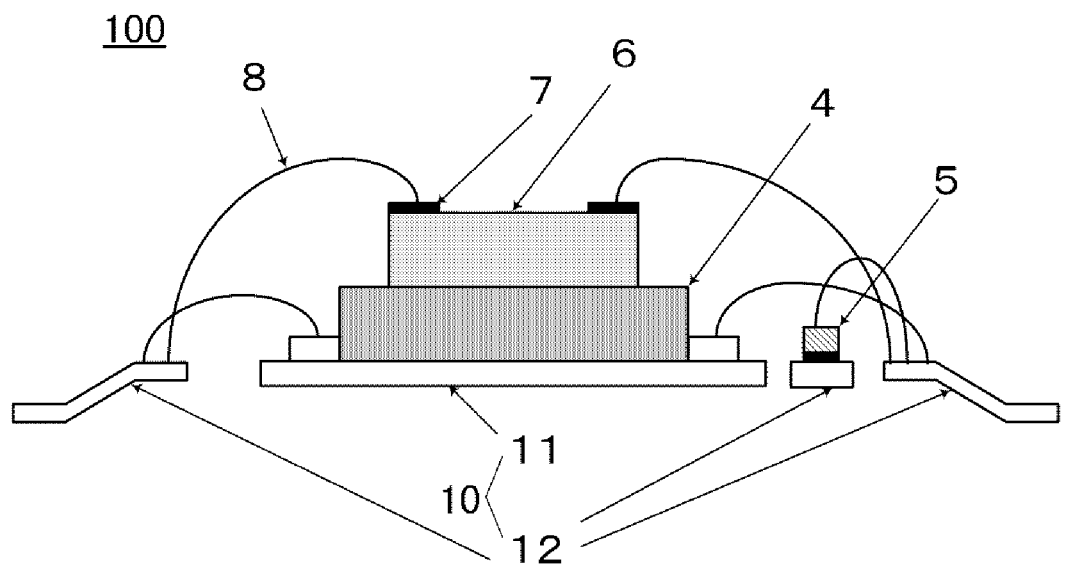
FIG. 4A is a sectional drawing of an oven-controlled crystal oscillator using a lead frame according to a second embodiment disclosed here.
Figure 4B:
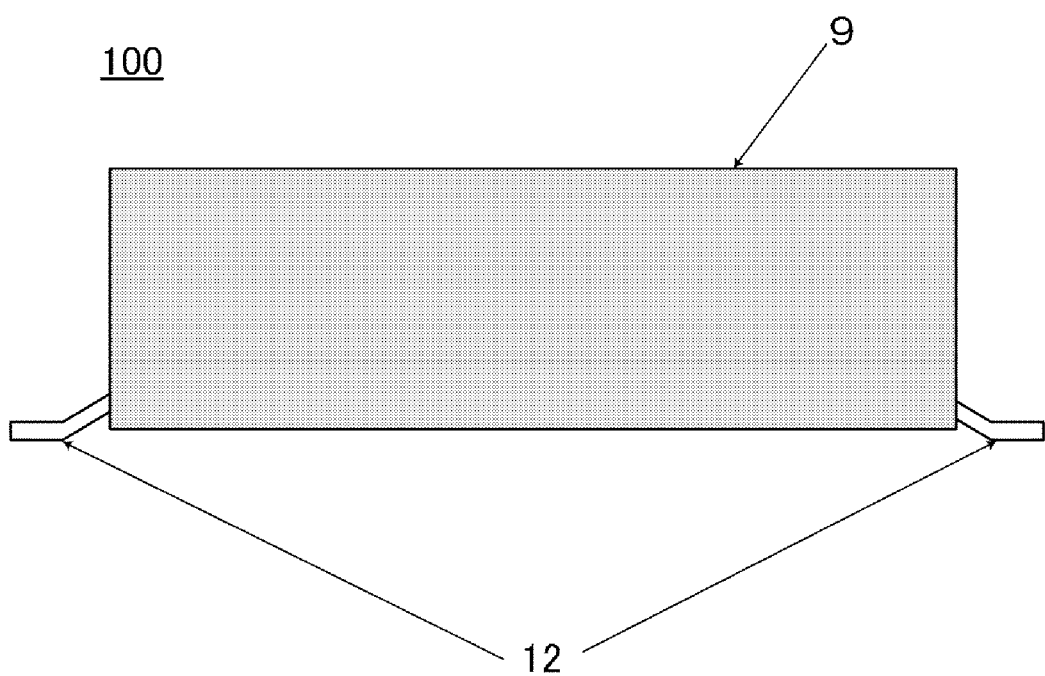
FIG. 4B is a side view the oven-controlled crystal oscillator where the lead frame is resin sealed according to the second embodiment disclosed here.
Figure 5:
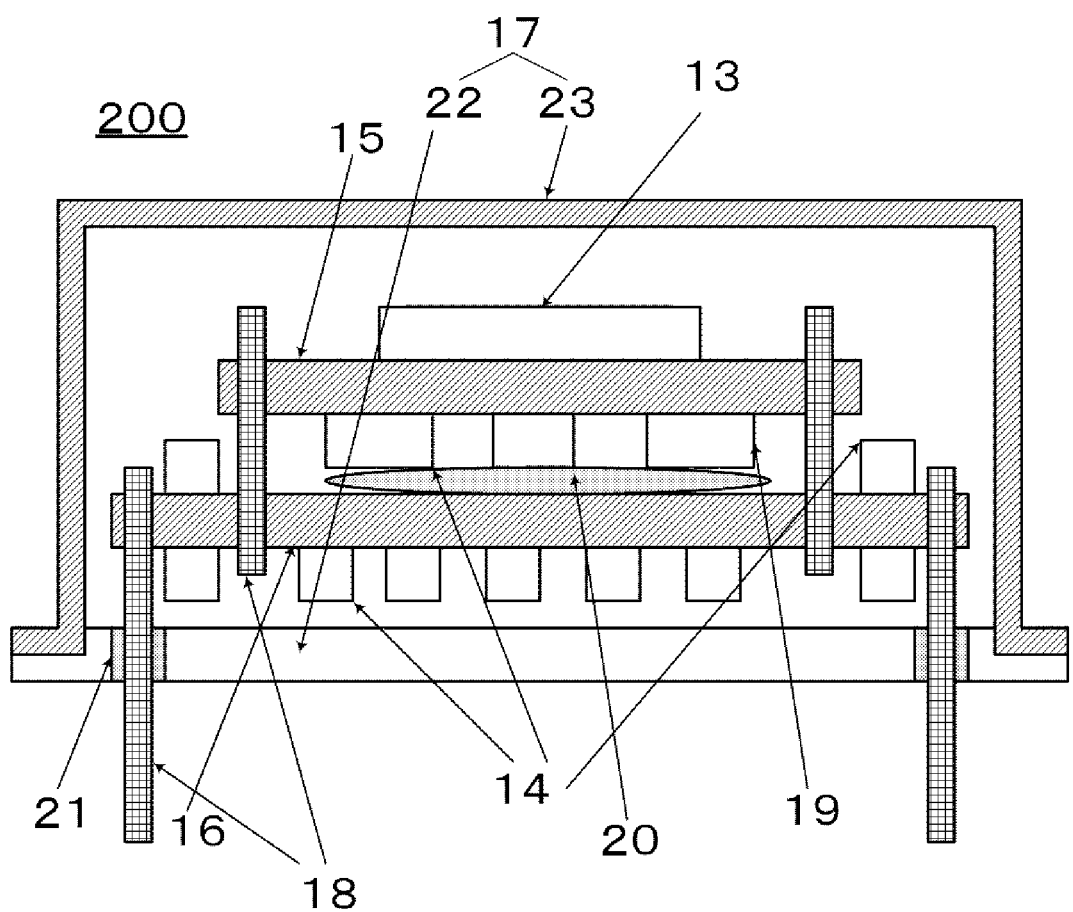
FIG. 5 is a sectional drawing illustrating a configuration of a related oven-controlled crystal oscillator.

FIG. 4A is a sectional drawing of the oven-controlled crystal oscillator 100 using a lead frame 10 according to the second embodiment of this disclosure. In FIG. 4A, the mold resin 9 used for sealing is not illustrated. FIG. 4B is a side view of the oven-controlled crystal oscillator 100 where the lead frame 10 is resin molded according to the second embodiment of this disclosure.

While in the first embodiment, each of the circuit elements, such as the power transistor 4, is mounted on the base substrate 2, in the second embodiment, it is different in that each of the circuit elements is mounted on the lead frame 10.

For the lead frame 10, one that is made of iron and copper alloy, specifically, Fe alloy, such as alloy 42, or Cu alloy, such as Cu—Sn and Cu—Fe, or ternary alloy that is made by adding a third element to these, is used. The lead fame 10 is constituted of an island portion 11 and a plurality of lead terminals 12.

The power transistor 4 is bonded to the island portion 11 of the lead frame 10 using an insulating adhesive. In an outer periphery portion of the lead frame 10, the plurality of lead terminals 12 are disposed. Between each of the terminals of the emitter, the collector, the base, and similar part of the power transistor 4 and the lead terminals 12 are connected with the bonding wires 8.

Similar to the first embodiment, the surface mount type crystal resonator 6 is bonded with the lid side, which is the bottom surface, on the upper surface of the power transistor 4 while the base side on which the external terminals 7 are formed facing upward. Similar to each of the terminals of the power transistor 4, between the external terminals 7 of the surface mount type crystal resonator 6 and the lead terminals 12 are connected with the bonding wires 8. The thermosensor 5 is mounted on the individual lead terminal 12 and connected in between other lead terminals 12 with the bonding wires 8.

After the power transistor 4, the surface mount type crystal resonator 6, and each of the circuit elements, such as the thermosensor 5, are mounted on the lead frame 10, and the lead terminals 12 and the respective terminals of each of the circuit elements are connected with the bonding wires 8, the oven-controlled crystal oscillator of this disclosure is sealed with the mold resin 9. In this respect, the oven-controlled crystal oscillator of this disclosure may be diced to be an individual chip after performing resin molding after each of the circuit elements, such as the power transistor 4, are bonded on the individual island portions 11 with a plurality of the lead frames 10 are in a consecutive state on the surface and between the terminals of each of the circuit elements and the lead terminals 12 are electrically connected with the bonding wires 8.

In the oven-controlled crystal oscillator 100 according to the second embodiment of this disclosure, using, for example, the lead frame 10, the mold resin 9, and the surface mount type crystal resonator 6 of a general-purpose product can manufacture a product that is uniform quality in a large amount and at a low-price.

While the present disclosure has been described above with reference to the embodiments, the technical scope of the disclosure is not limited to the scope of the embodiments described above. It is apparent that a variety of variations and modifications of the above-described embodiments can be made by those skilled in the art. It is apparent from accompanying claims that such variations and modifications may also be encompassed by the technical scope of the disclosure.

In the oven-controlled crystal oscillator disclosed here, the power transistor may have a surface area on a side opposing the surface mount type crystal resonator larger than a surface area of the surface mount type crystal resonator on a side opposing the power transistor. In the oven-controlled crystal oscillator disclosed here, a thermosensor in addition to the surface mount type crystal resonator may be mounted on the power transistor.

In the oven-controlled crystal oscillator disclosed here, a circuit element that constitutes an oscillator circuit may be further mounted on the power transistor. In the oven-controlled crystal oscillator disclosed here, the base substrate and the surface mount type crystal resonator may be electrically connected with a wire bonding.

In the oven-controlled crystal oscillator disclosed here, the power transistor and the surface mount type crystal resonator may be bonded with a resin adhesive. In the oven-controlled crystal oscillator disclosed here, the power transistor and the surface mount type crystal resonator on the base substrate may be covered with a mold resin.

The surface mount type crystal resonator and the thermosensor are directly disposed to a heat source constituted of the power transistor. Such configuration prevents a wasteful heat emittance and ensures an efficient heat transmission. Therefore, an oven-controlled crystal oscillator with low power consumption is achievable. Furthermore, burying peripheral area of the surface mount type crystal resonator, the power transistor, and the thermosensor that are closely disposed with a resin reduces an influence from an outside where a temperature change is severe. Also, an addition of the resin increases a heat capacity of the whole oven-controlled crystal oscillator. Thus, inside the oven-controlled crystal oscillator can be thermally stabilized.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An oven-controlled crystal oscillator comprising:
   a base substrate that has a bottom surface on which a mounting terminal for surface mounting is disposed;
   a heat source mounted on the base substrate, wherein the heat source has a planar upper surface; and
   a surface mount type crystal resonator having a lower surface that is bonded onto the planar upper surface of the heat source, wherein the planar upper surface of the heat source has a surface area on a side opposing the lower surface of the surface mount type crystal resonator larger than a surface area of the lower surface of the surface mount type crystal resonator on a side opposing the planar upper surface of the heat source.

2. The oven-controlled crystal oscillator according to claim 1, wherein
   a thermosensor in addition to the surface mount type crystal resonator is mounted on the planar upper surface of the heat source.

3. The oven-controlled crystal oscillator according to claim 1, wherein
   a thermosensor is mounted on the surface mount type crystal resonator.

4. The oven-controlled crystal oscillator according to claim 1, wherein
   a circuit element that constitutes an oscillator circuit is further mounted on the heat source.

5. The oven-controlled crystal oscillator according to claim 1, wherein
   the base substrate and the surface mount type crystal resonator are electrically connected with a wire bonding.

6. The oven-controlled crystal oscillator according to claim 1, wherein
   the heat source and the surface mount type crystal resonator are bonded with a resin adhesive.

7. The oven-controlled crystal oscillator according to claim 1, wherein
   the heat source and the surface mount type crystal resonator on the base substrate are covered with a mold resin.

8. An oven-controlled crystal oscillator comprising:
   a base substrate that has a bottom surface on which a mounting terminal for surface mounting is disposed;
   a heat source mounted on the base substrate, wherein the heat source has a planar upper surface;
   a surface mount type crystal resonator mounted on the planar upper surface of the heat source; and
   a thermosensor located on a same plane with the surface mount type crystal resonator and mounted on the planar upper surface of the heat source.

9. The oven-controlled crystal oscillator according to claim 8, wherein
   a circuit element that constitutes an oscillator circuit is further mounted on the heat source.

10. The oven-controlled crystal oscillator according to claim 8, wherein
    the base substrate and the surface mount type crystal resonator are electrically connected with a wire bonding.

11. The oven-controlled crystal oscillator according to claim 8, wherein
    the heat source and the surface mount type crystal resonator are bonded with a resin adhesive.

12. The oven-controlled crystal oscillator according to claim 8, wherein
    the heat source and the surface mount type crystal resonator on the base substrate are covered with a mold resin.

13. An oven-controlled crystal oscillator comprising:
    a base substrate that has a bottom surface on which a mounting terminal for surface mounting is disposed;
    a heat source mounted on the base substrate;
    a surface mount type crystal resonator mounted on the heat source, wherein a bottom surface of the surface mount type crystal resonator is bonded to the heat source with a resin adhesive, so that the resin adhesive is only sandwiched between the surface mount type crystal resonator and the heat source; and a thermosensor is mounted on an upper surface of the surface mount type crystal resonator and in contact with the upper surface.

14. The oven-controlled crystal oscillator according to claim 13, wherein a circuit element that constitutes an oscillator circuit is further mounted on the heat source.

15. The oven-controlled crystal oscillator according to claim 13, wherein the base substrate and the surface mount type crystal resonator are electrically connected with a wire bonding.

16. The oven-controlled crystal oscillator according to claim 13, wherein the heat source and the surface mount type crystal resonator on the base substrate are covered with a mold resin.

* * * * *